United States Patent
Schmitt et al.

(10) Patent No.: US 10,109,364 B2
(45) Date of Patent: Oct. 23, 2018

(54) NON-VOLATILE MEMORY CELL HAVING MULTIPLE SIGNAL PATHWAYS TO PROVIDE ACCESS TO AN ANTIFUSE OF THE MEMORY CELL

(71) Applicant: Avago Technologies General IP (Singapore) Pte. Ltd., Singapore (SG)

(72) Inventors: Jonathan A. Schmitt, Eden Prairie, MN (US); Jermyn Tseng, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/925,543

(22) Filed: Oct. 28, 2015

(65) Prior Publication Data

US 2017/0117058 A1    Apr. 27, 2017

Related U.S. Application Data

(60) Provisional application No. 62/244,392, filed on Oct. 21, 2015.

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC .................................................... G11C 17/165
USPC ........................................................... 365/96
See application file for complete search history.

(56) References Cited

U.S. PATENT DOCUMENTS

| | | | | |
|---|---|---|---|---|
| 5,257,222 A * | 10/1993 | Lee | .......... | G11C 17/16 257/530 |
| 5,886,940 A * | 3/1999 | Morzano | .......... | G11C 8/12 365/204 |
| 5,923,672 A * | 7/1999 | Roberts | .......... | G11C 29/785 714/710 |
| 6,301,172 B1 * | 10/2001 | Derner | .......... | G11C 11/404 365/201 |
| 6,570,798 B1 * | 5/2003 | McCollum | .......... | G11C 17/16 327/525 |
| 6,671,040 B2 * | 12/2003 | Fong | .......... | G11C 11/5692 257/E21.666 |
| 6,927,997 B2 * | 8/2005 | Lee | .......... | G11C 17/16 365/177 |

(Continued)

*Primary Examiner* — Anthan Tran
*Assistant Examiner* — Mushfique Siddique
(74) *Attorney, Agent, or Firm* — Sterne, Kessler, Goldstein & Fox P.L.L.C.

(57) ABSTRACT

A non-volatile memory cell, having an antifuse for storing data, is disclosed for use in a non-volatile data storage device. The non-volatile memory cell includes multiple redundant signal pathways to provide redundant access to the antifuse. During operation, the non-volatile memory cell can access the antifuse using a first signal pathway from among the multiple redundant signal pathways. However, when the first signal pathway is inoperable, the non-volatile memory cell is able to access the antifuse using a second signal pathway from among the multiple redundant signal pathways. The non-volatile memory cell is fabricated using a continuous region of one or more diffusion layers to allow efficient connection to other non-volatile memory cells to form an array of memory cells for the non-volatile data storage device.

25 Claims, 3 Drawing Sheets

(56) References Cited

U.S. PATENT DOCUMENTS

| | | | | |
|---|---|---|---|---|
| 7,206,214 B2* | 4/2007 | Hoefler | | G11C 17/16 257/E27.102 |
| 7,606,055 B2* | 10/2009 | Liu | | G11C 11/16 365/163 |
| 7,715,247 B2* | 5/2010 | Kim | | G11C 7/06 365/102 |
| 7,978,502 B2* | 7/2011 | Damien | | G11C 17/16 365/102 |
| 8,026,574 B2* | 9/2011 | Kurjanowicz | | G11C 17/16 257/288 |
| 8,031,506 B2* | 10/2011 | Schmitt | | G11C 17/16 257/209 |
| 8,199,590 B1* | 6/2012 | Novosel | | G11C 17/16 365/189.2 |
| 8,767,433 B2* | 7/2014 | Kurjanowicz | | G11C 17/16 365/200 |
| 9,087,588 B2* | 7/2015 | Kwon | | G11C 17/06 |
| 9,136,217 B2* | 9/2015 | Schmitt | | H01L 27/101 |
| 9,330,794 B1* | 5/2016 | Miyatake | | G11C 29/783 |
| 9,601,499 B2* | 3/2017 | Wu | | H01L 27/11206 |
| 9,620,176 B2* | 4/2017 | Wu | | H03K 17/161 |
| 2002/0075744 A1* | 6/2002 | McCollum | | G11C 17/16 365/225.7 |
| 2002/0110033 A1* | 8/2002 | Forbes | | G11C 8/10 365/225.7 |
| 2004/0071007 A1* | 4/2004 | Pecheyran | | G11C 17/16 365/145 |
| 2004/0190335 A1* | 9/2004 | Pascucci | | G11C 16/0475 365/185.01 |
| 2004/0208055 A1* | 10/2004 | Wang | | G11C 11/5692 365/182 |
| 2005/0007855 A1* | 1/2005 | Lee | | G11C 17/16 365/225.7 |
| 2005/0018508 A1* | 1/2005 | Kurth | | G11C 11/005 365/203 |
| 2006/0092742 A1* | 5/2006 | Paillet | | G11C 17/146 365/225.7 |
| 2007/0268742 A1* | 11/2007 | Liu | | G11C 11/16 365/163 |
| 2008/0074915 A1* | 3/2008 | Terzioglu | | G11C 17/16 365/96 |
| 2008/0117660 A1* | 5/2008 | Xu | | G11C 17/16 365/96 |
| 2009/0059645 A1* | 3/2009 | Schmitt | | G11C 17/18 365/96 |
| 2009/0237974 A1* | 9/2009 | Schmitt | | G11C 17/16 365/96 |
| 2010/0232203 A1* | 9/2010 | Chung | | G11C 17/16 365/96 |
| 2011/0103127 A1* | 5/2011 | Kurjanowicz | | G11C 17/16 365/96 |
| 2011/0121366 A1* | 5/2011 | Or-Bach | | H01L 21/6835 257/204 |
| 2011/0210339 A1* | 9/2011 | Yamazaki | | G11C 11/24 257/77 |
| 2011/0249484 A1* | 10/2011 | Takemura | | G11C 11/404 365/72 |
| 2012/0182782 A1* | 7/2012 | Kurjanowicz | | G11C 17/16 365/94 |
| 2013/0051113 A1* | 2/2013 | Kwon | | G11C 17/06 365/105 |
| 2013/0062698 A1* | 3/2013 | Agam | | H01L 21/76 257/368 |
| 2013/0062703 A1* | 3/2013 | Agam | | H01L 23/5252 257/369 |
| 2013/0063999 A1* | 3/2013 | Agam | | G11C 17/16 365/104 |
| 2013/0077377 A1* | 3/2013 | Kim | | G11C 17/08 365/104 |
| 2013/0270559 A1* | 10/2013 | Hafez | | H01L 27/11206 257/50 |
| 2013/0308365 A1* | 11/2013 | Smith | | G11C 17/18 365/96 |
| 2013/0322150 A1* | 12/2013 | Kim | | G11C 17/16 365/104 |
| 2014/0071731 A1* | 3/2014 | Schmitt | | H01L 27/101 365/104 |
| 2014/0340955 A1* | 11/2014 | Wu | | H01L 27/11206 365/104 |
| 2015/0194433 A1* | 7/2015 | Ponoth | | H01L 27/0924 326/38 |
| 2015/0200196 A1* | 7/2015 | Ponoth | | H01L 23/5252 257/379 |
| 2016/0012894 A1* | 1/2016 | Lai | | G11C 16/08 365/185.18 |
| 2016/0141295 A1* | 5/2016 | Wu | | H01L 27/11206 365/96 |
| 2016/0148705 A1* | 5/2016 | Lee | | G11C 17/18 365/96 |
| 2017/0053925 A1* | 2/2017 | Wong | | H01L 23/5226 |
| 2017/0076757 A1* | 3/2017 | Wu | | H03K 17/161 |

* cited by examiner

NON-VOLATILE MEMORY CELL HAVING MULTIPLE SIGNAL PATHWAYS TO PROVIDE ACCESS TO AN ANTIFUSE OF THE MEMORY CELL

CROSS-REFERENCE TO RELATED APPLICATIONS

The present application claims the benefit of U.S. Provisional Patent Appl. No. 62/244,392, filed Oct. 21, 2015, which is incorporated herein by reference in its entirety.

BACKGROUND

Field of Disclosure

The present disclosure relates generally to a non-volatile data storage device, and including a one-time programmable (OTP) memory cell of the non-volatile data storage device.

Related Art

A memory is an electronic device for storing electronic data. Each bit of the electronic data can be read from and/or written into a memory cell. Each of the memory cells can be coupled to one another to form an array of memory cells, or simply a memory, which can be accessible through various control lines that can be selected or toggled to read and/or write the electronic data. The memory can be implemented as volatile memory, such as random access memory (RAM), which requires power to maintain its stored electronic data or non-volatile memory, such as read-only memory (ROM), which can maintain its stored electronic data even when not powered. A standard ROM, a programmable read-only memory (PROM), a field programmable read-only memory (FPROM), or a one-time programmable non-volatile memory (OTP NVM) are forms of non-volatile memory that are permanently programmed to store the electronic data. These types of non-volatile memories are frequently used in microcontrollers, video game consoles, mobile phones, radio-frequency identification (RFID) tags, implantable medical devices, high-definition multimedia interfaces (HDMI) and in many other consumer and automotive electronics products.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears. In the accompanying drawings.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

Overview

A non-volatile memory cell, having an antifuse for storing data, is disclosed for use in a non-volatile data storage device. The non-volatile memory cell includes multiple redundant signal pathways to provide redundant access to the antifuse. During operation, the non-volatile memory cell can access the antifuse using a first signal pathway from among the multiple redundant signal pathways. However, when the first signal pathway is inoperable, the non-volatile memory cell is able to access the antifuse using a second signal pathway from among the multiple redundant signal pathways. The non-volatile memory cell is fabricated using a continuous region of one or more diffusion layers to allow efficient connection to other non-volatile memory cells to form an array of memory cells for the non-volatile data storage device.

Non-Volatile Data Storage Device

Figure 1:
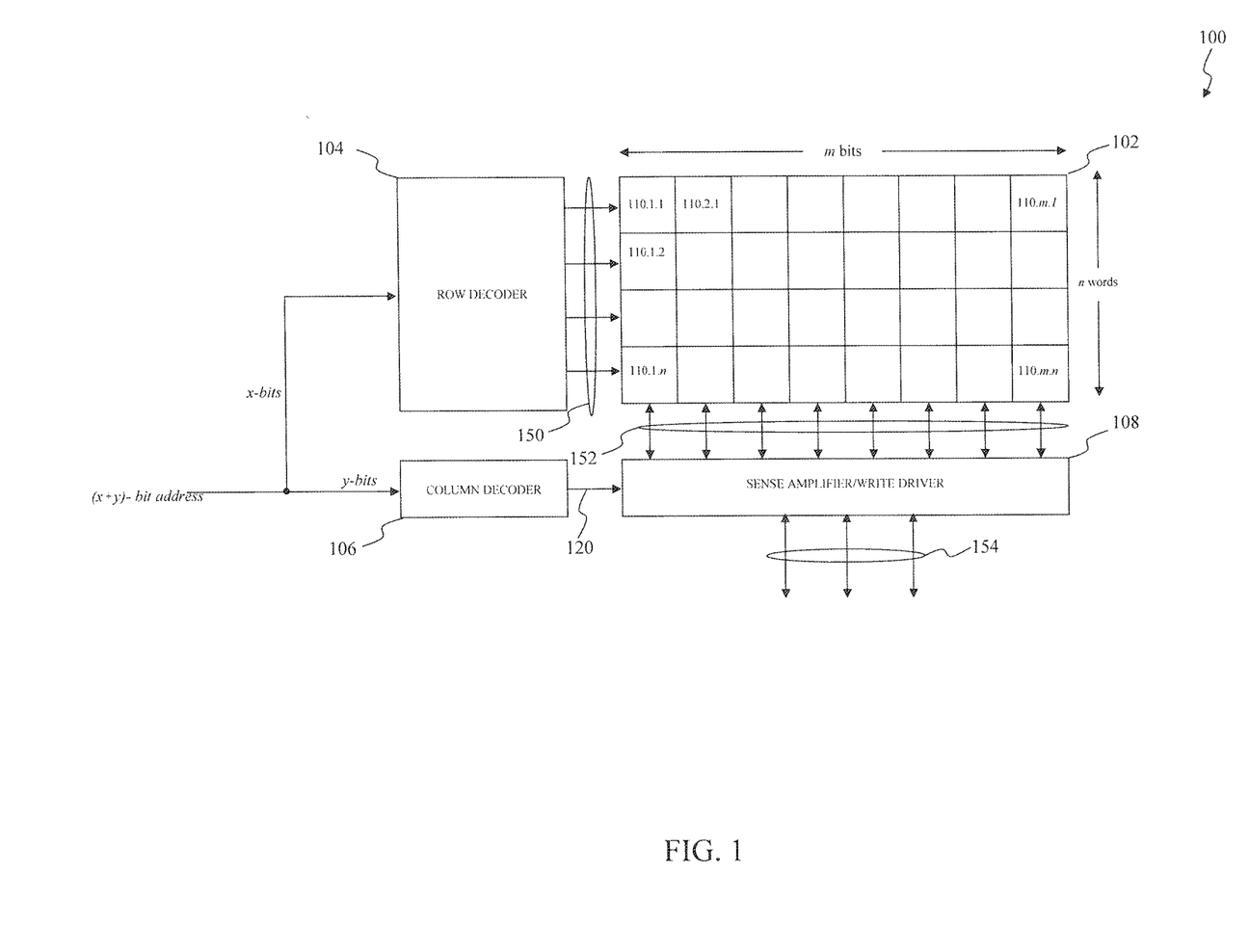
FIG. 1 illustrates a block diagram of a non-volatile data storage device according to an exemplary embodiment of the present disclosure.

FIG. 1 illustrates a block diagram of a non-volatile data storage device according to an exemplary embodiment of the present disclosure. A non-volatile data storage device 100 operates in a write mode of operation to write electronic data to one or more non-volatile memory cells that form an array of non-volatile memory cells or a read mode of operation to read to electronic data from the one or more non-volatile memory cells. In the read mode of operation, the non-volatile data storage device 100 reads electronic data from one or more non-volatile memory cells that correspond to an (x+y)-bit address. Similarly, the non-volatile data storage device 100 writes electronic data to one or more non-volatile memory cells that correspond to the (x+y)-bit address in the write mode of operation. The non-volatile data storage device 100 can be implemented as a standard read-only memory (ROM), a programmable read-only memory (PROM), a field programmable read-only memory (FPROM), or a one-time programmable non-volatile memory (OTP NVM) or any other non-volatile data storage device which maintains the electronic data even when not powered that will be apparent to those skilled in the relevant art(s) without departing from the spirit and scope of the present disclosure.

The non-volatile data storage device 100 includes a non-volatile memory array 102, a row decoder 104, a column decoder 106, and a sense amplifier/write driver 108. The non-volatile memory array 102 includes non-volatile memory cells 110.1.1 through 110.*m.n* that are arranged in an array of m columns and n rows. However, other arrangements for non-volatile memory cells 110.1.1 through 110.*m.n* are possible without departing from the spirit and scope of the present disclosure. Each of the non-volatile memory cells 110.1.1 through 110.*m.n* is connected to one or more corresponding wordlines (WLs) from among WLs 150.1 through 150.*n* and one or more corresponding bitlines (BLs) from among BLs 152.1 through 152.*m*. In an exemplary embodiment, the non-volatile memory cells 110.1.1 through 110.*m.n* in each of the m columns of non-volatile memory array 102 shares one or more common BLs from among the BLs 152.1 through 152.*m*. Similarly, the non-volatile memory cells 110.1.1 through 110.*m.n* in each of n rows of non-volatile memory array 102 share one or more common WLs from among WLs 150.1 through 150.*n*. To access a particular non-volatile memory cell from among the non-volatile memory cells 110.1.1 through 110.*m.n*, the one or more BLs associated with the particular non-volatile memory cell is selected or toggled, and the one or more WLs associated with the particular non-volatile memory cell is selected or toggled. Thereafter, electronic data is written into the accessed non-volatile memory cell in the write mode of operation, or electronic data is read from the accessed non-volatile memory cell in the read mode of operation.

Each of WLs 150.1 through 150.n is selected or toggled by applying a corresponding x-bit row address from among a corresponding (x+y)-bit address to row decoder 104. A non-volatile data storage device controller, not shown in FIG. 1, can be used to provide the x-bit row address to the non-volatile data storage device 100. The row decoder 104 decodes the corresponding x-bit row address and selects or toggles the one or more WLs 150.1 through 150.n that correspond to the x-bit row address to select or toggle a row of non-volatile memory cells from among the non-volatile memory cells 110.1.1 through 110.m.n. Similarly, one or more of the BLs 152.1 through 152.m is selected or toggled by applying a corresponding y-bit column address from among the corresponding (x+y)-bit address to the column decoder 106. The column decoder 106 decodes the y-bit column address and provides one or more control signals 120 to the sense amplifier/write driver 108 that correspond to the y-bit column address.

One or more of the non-volatile memory cells 110.1.1 through 110.m.n can be implemented using an OTP device, such as an antifuse to provide an example. When operating in a programmed state, the antifuse operates in a similar manner as a conductive short circuit pathway, or other low resistance pathway. When programmed, the OTP device is considered to have stored a first logical value, such as a logical one to provide an example. When operating in a non-programmed state, the antifuse operates in a similar manner as a non-conductive open circuit pathway, or other high resistance pathway, until programmed. When not programmed, the OTP device is considered to have stored a second logical value, such as a logical zero to provide an example.

The sense amplifier/write driver 108 accesses a column of non-volatile memory cells from among the non-volatile memory cells 110.1.1 through 110.m.n corresponding to the y-bit column address in response to the one or more control signals 120. The sense amplifier/write driver 108, using one or more sense amplifiers, toggles or selects the one or more BLs from among BLs 152.1 through 152.m that correspond to the column of non-volatile memory cells. Thereafter, the one or more sense amplifiers read the electronic data 154 from a non-volatile memory cell from among the non-volatile memory cells that corresponds to a selected or toggled WL from among the WLs 150.1 through 150.n during the read mode of operation. Alternatively, the sense amplifier/write driver 108, using one or more write drivers, toggles or selects the one or more BLs from among BLs 152.1 through 152.m that correspond to the column of non-volatile memory cells. Thereafter, the one or more write drivers write the electronic data 154 to a non-volatile memory cell from among the non-volatile memory cells that corresponds to a selected or toggled WL from among the WLs 150.1 through 150.n during the write mode of operation.

Figure 2:
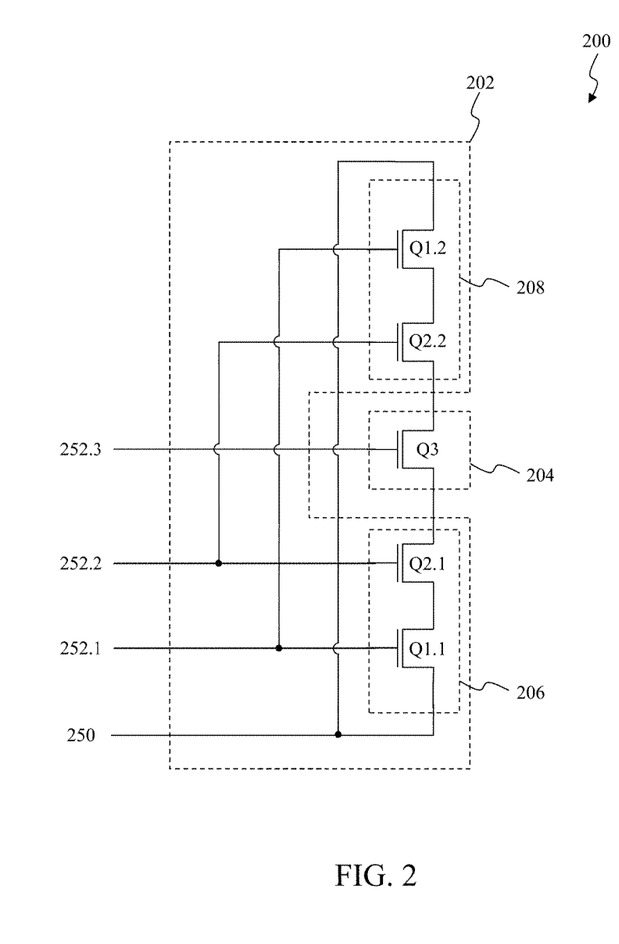
FIG. 2 illustrates a schematic diagram of a non-volatile memory cell that can be implemented within the non-volatile data storage device according to an exemplary embodiment of the present disclosure.

Exemplary Non-Volatile Memory Cell that can be Implemented with the OTP Data Storage Device FIG. 2 illustrates a schematic diagram of a non-volatile memory cell that can be implemented within the non-volatile data storage device according to an exemplary embodiment of the present disclosure. A non-volatile data storage device, such as the non-volatile data storage device 100 to provide an example, can read electronic data from a non-volatile memory cell 200 in a read mode of operation and/or write electronic data to the non-volatile memory cell 200 in a write mode of operation. As illustrated in FIG. 2, the non-volatile memory cell 200 includes memory access circuitry 202 and an antifuse 204. The non-volatile memory cell 200 can be represent an exemplary embodiment of one or more of the non-volatile memory cells 110.1.1 through 110.m.n to provide an example.

The memory access circuitry 202 provides access to the antifuse 204 to the non-volatile memory cell 200. As illustrated in FIG. 2, the memory access circuitry 202 includes access transistors Q1.1 and Q1.2 serially connected to biasing transistors Q2.1 and Q2.2, respectively, to provide redundant signal pathways to access to the antifuse 204. The access transistors Q1.1 and Q1.2 and the biasing transistors Q2.1 and Q2.2 are implemented using n-type metal-oxide-semiconductor field-effect transistors (NMOSFETs); however, those skilled in the relevant art(s) will recognize that other types of switching devices, such as others types of field-effect transistors (FETs), bipolar junction transistors (BJTs), or diodes to provide some examples, are possible without departing from the spirit and scope of the present disclosure.

In an exemplary embodiment, the access transistors Q1.1 and Q1.2 and the biasing transistors Q2.1 and Q2.2 represent thin oxide transistors. In another exemplary embodiment, the access transistors Q1.1 and Q1.2 represent thin oxide transistors and the biasing transistors Q2.1 and Q2.2 represent thick oxide transistors having a thicker gate oxide when compared to a gate oxide of the thin oxide access transistors Q1.1 and Q1.2. In this exemplary embodiment, the thinner gate oxide of the thin oxide access transistors Q1.1 and Q1.2 allows the thin oxide access transistors Q1.1 and Q1.2 to turn off and/or on at faster rate when compared to the biasing transistors Q2.1 and Q2.2. However, a programming voltage $V_{PROGAM}$ of the antifuse 204, which is to be discussed below, can exceed a breakdown voltage of the access transistors Q1.1 and Q1.2. The biasing transistors Q2.1 and Q2.2, therefore, prevent the access transistors Q1.1 and Q1.2 from exceeding their respective breakdown voltages. In a further exemplary embodiment, the biasing transistors Q2.1 and Q2.2 are not needed. This further exemplary embodiment can be used when the programming voltage $V_{PROGAM}$ of the antifuse 204 is likely not to exceed the breakdown voltage of the access transistors Q1.1 and Q1.2. In a yet further exemplary embodiment, more biasing transistors Q2.1 and Q2.2 can be included within the memory access circuitry 202 between the access transistors Q1.1 and Q1.2 and the antifuse 204. This yet further exemplary embodiment can be used when the programming voltage $V_{PROGAM}$ of the antifuse 204 is likely to exceed the breakdown voltage of the biasing transistors Q2.1 and Q2.2.

The redundant signal pathways include a first signal pathway 206 having the access transistor Q1.1 and the biasing transistor Q2.1 and second signal pathway 208 having the access transistor Q1.2 and the biasing transistor Q2.2. The first signal pathway 206 and the second signal pathway 208 provide redundancy to access the antifuse 204 allowing the antifuse 204 to remain accessible when either of these signal pathways is inoperable. As illustrated in FIG. 2, the first signal pathway 206 and the second signal pathway 208 can be activated by asserting wordlines (WLs) 252.1 and 252.2 to allow the BL 250 to access the antifuse 204. In an exemplary embodiment, the BL 250 and the WLs 252.1 through 252.3 and can represent exemplary embodiments of one or more of the BLs 152.1 through 152.n and one or more of WLs 150.1 through 150.n, respectively. In another exemplary embodiment, the WL 252.2 can be shared by other memory access circuitry 202 of other non-volatile memory cells 200 of the non-volatile data storage device. As illustrated in FIG. 2, the WLs 252.1 and 252.2 can be at a first logical level, such as a logical one to provide an example, to activate the access transistor Q1.1 and the biasing transistor Q2.1 to form the first serial signal pathway and to activate the access transistor Q1.2 and the biasing transistor Q2.2 to form the second serial signal pathway. The first signal pathway 206 and the second signal pathway 208 can be deactivated by when the WLs 252.1 and 252.2 are at a second logical level, such as a logical zero to provide an example.

The antifuse 204 can operate in a programmed state or in a non-programmed state. In the non-programmed state, the antifuse 204 operates as a non-conductive open circuit pathway, or other high resistance pathway, between the WL 252.3 and/or the first signal pathway 206 or the second signal pathway 208. The antifuse 204 operates as a conductive closed circuit pathway, or other low resistance pathway, between the WL 252.3 and the first signal pathway 206 or the second signal pathway 208 when in the programmed state. The antifuse 204 includes an antifuse transistor Q3. The antifuse transistor Q3 can be implemented using a single-oxide dielectric, such as silicon dioxide (SiO2) or an oxide-nitride-oxide (ONO) dielectric, such as silicon dioxide (SiO2)-silicon nitride (Si3N4)-silicon dioxide (SiO2) to provide some examples. In an exemplary embodiment, the access transistors Q1.1 and Q1.2, the biasing transistors Q2.1 and Q2.2, and/or the antifuse transistor Q3 can be implemented using FinFETs or any other suitable multiple gate field-effect transistors (MuGFETs) that will be recognized by those skilled in the relevant art(s) without departing from the spirit and scope of the present disclosure.

During the write mode of operation, the antifuse 204 is programmed to operate in the programmed state to store the first logical value. To program the antifuse 204; the WL 252.3 provides the programming voltage VPROGAM, which is greater than the first logical level, to a gate region of the antifuse transistor Q3; the WL 252.1 and 252.2 provides the first logical level to WL 252.1 and 252.2 to activate the access transistors Q1.1 and Q1.2 and the biasing transistors Q2.1 and Q2.2 to form the first signal pathway 206 and the second signal pathway 208; and the BL 250 is precharged to the second logical level. In this configuration, the programming voltage VPROGAM causes one or more ruptures in the dielectric of the antifuse transistor Q3 forming one or more conductive short circuit pathways, or other low resistance pathways, between the gate region and a drain region of the antifuse transistor Q3. This rupturing of the dielectric allow current to flow from the antifuse 204 through the first signal pathway 206 to the BL 250. Alternatively, if the first signal pathway 206 is inoperable, for example, the access transistor Q1.1 or the biasing transistor Q2.1 is defective, the programming voltage VPROGAM causes one or more ruptures in the dielectric of the antifuse transistor Q3 forming one or more conductive short circuit pathways, or other low resistance pathways, between the gate region and a source region of the antifuse transistor Q3. This rupturing of the dielectric allow current to flow from the antifuse 204 through the second signal pathway 208 to the BL 250. The biasing transistors Q2.1 and Q2.2 limits current flowing from the antifuse transistor Q3 to protect the access transistors Q1.1 and Q1.2 from exceeding their respective breakdown voltages after rupturing of the dielectric of the antifuse transistor Q3.

However, no programming of the antifuse 204 is necessary for the antifuse 204 to operate in the non-programmed state to store the second logical value. The antifuse 204 is essentially a non-conductive open circuit pathway, or other high resistance pathway, until programmed. In this configuration, no current will flow from the WL 252.3 through the antifuse 204 to the first signal pathway 206 and/or the second signal pathway 208.

During the read mode of operation, the non-volatile data storage device determines whether current is flowing through the antifuse 204 to determine whether the antifuse 204 is storing the first logical value or the second logical value. To make this determination: the WL 252.3 provides the first logical level, which is less than the programming voltage VPROGAM, to the gate region; and the WL 252.1 and 252.2 provides the first logical level to activate the access transistors Q1.1 and Q1.2 and the biasing transistors Q2.1 and Q2.2 to form the first signal pathway 206 and the second signal pathway 208. When the antifuse 204 is programmed, namely, storing the first logical value, current flows from the WL 252.3 through the antifuse 204 onto the BL 250 via the first signal pathway 206 or the second signal pathway 208. The non-volatile data storage device can measure the BL 250 to detect the presence of this current, for example, through a sense amplifier, such as the sense amplifier/write driver 108 to provide an example. When this current is present, the non-volatile data storage device determines the antifuse 204 is storing the first logical value.

Otherwise, when the antifuse 204 is non-programmed, namely, storing the second logical value, no current flows from the WL 252.3 through the antifuse 204 onto the BL 250 via the first signal pathway 206 or the second signal pathway 208. The non-volatile data storage device can measure the BL 250 to detect the absence of current flowing through the antifuse 204. When the current is absent, the non-volatile data storage device determines the antifuse 204 is storing the second logical value.

Integrated Circuit Layout of the Exemplary Non-Volatile Memory Cell

Figure 3:
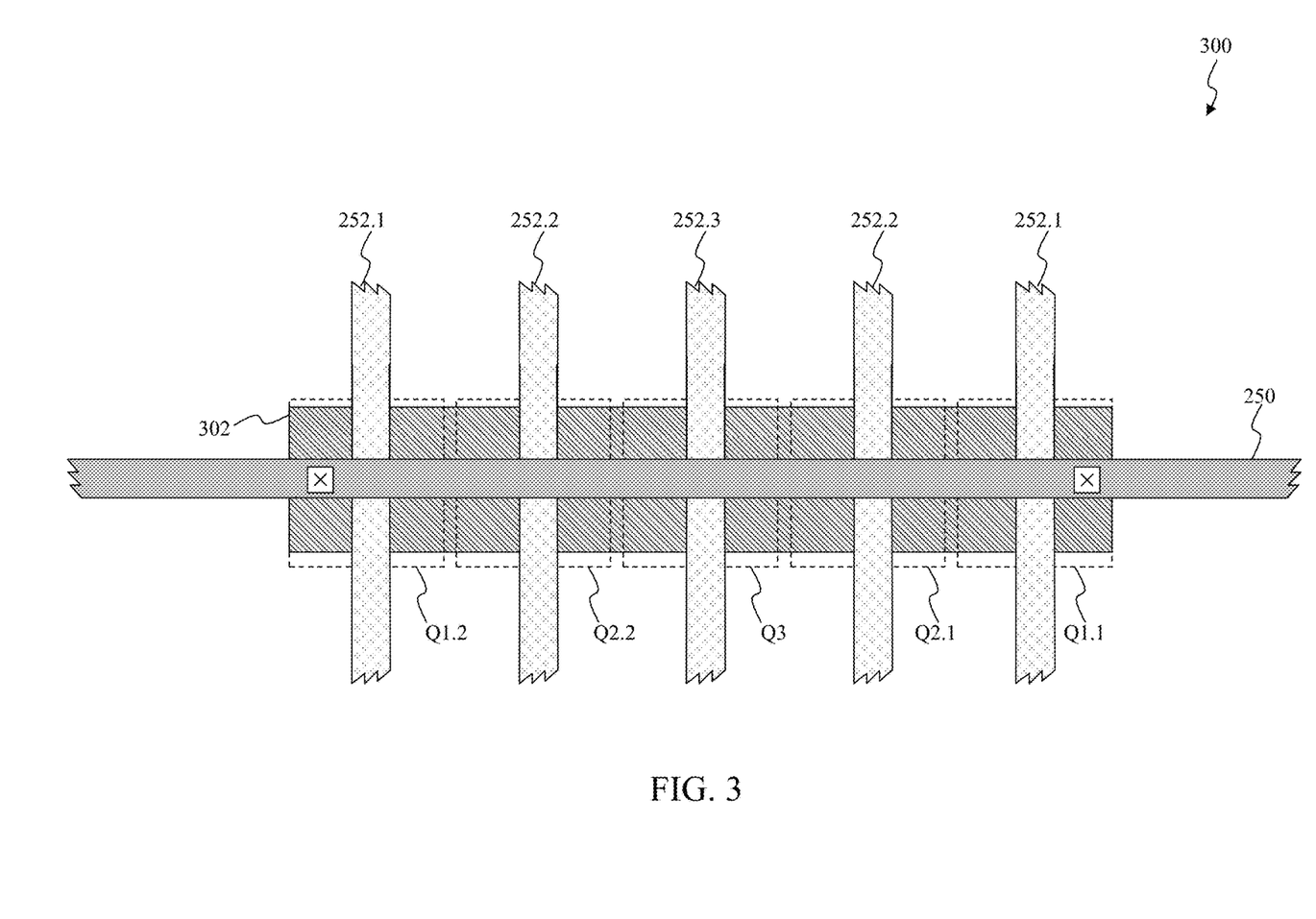
FIG. 3 illustrates an integrated circuit layout of the non-volatile memory cell according to an exemplary embodiment of the present disclosure.

FIG. 3 illustrates an integrated circuit layout of the non-volatile memory cell according to an exemplary embodiment of the present disclosure. An integrated circuit fabrication layout 300 illustrates a non-volatile memory cell, such as the non-volatile memory cell 200 to provide an example, that is defined in terms of planar geometric shapes within one or more diffusion layers, one or more polysilicon layers, one or more metal layers of a semiconductor layer stack and/or one or more interconnections, such as contacts or vias to provide some examples, between various layers of the semiconductor layer stack.

As illustrated in FIG. 3, the access transistors Q1.1 and Q1.2, the biasing transistors Q2.1 and Q2.2, and the antifuse transistor Q3 are situated within a continuous region 302 of the one or more diffusion layers, illustrated using hashed gray shading in FIG. 3, of the semiconductor layer stack. The continuous region 302 of the one or more diffusion layers, also referred to as one or more oxide diffusion (OD) layers, form active regions of the access transistors Q1.1 and Q1.2, the biasing transistors Q2.1 and Q2.2, and the antifuse transistor Q3. In an exemplary embodiment, the continuous region 302 of the one or more diffusion layers can be used to form other transistors of other non-volatile memory cells within a row or a column of a memory array of the non-volatile data storage device to allow efficient connection to other non-volatile memory cells of the memory array. This is in contrast to conventional non-volatile storage devices having conventional non-volatile memory cells.

These conventional non-volatile storage devices form their conventional non-volatile memory cells using discrete regions of diffusion layers with various separations, free of diffused oxide, forming the discrete regions. These separations increase the real estate occupied by these conventional non-volatile storage devices when compared to the non-volatile data storage device of the present disclosure. Additionally, these conventional non-volatile storage devices include poly over diffusion edge (PODE) devices, used to protect conventional non-volatile memory cells during fabrication, at edges of each of the discrete regions of the diffusion layers further increasing the real estate occupied by these conventional non-volatile storage devices. These PODE devices are not required when the continuous region 302 of the one or more diffusion layers is used to fabricate the access transistors Q1.1 and Q1.2, the biasing transistors Q2.1 and Q2.2, and the antifuse transistor Q3.

As illustrated in FIG. 3, the drain regions of the access transistors Q1.1 and Q1.2 are connected to the BL 250 using interconnections, illustrated as a squared "x" in FIG. 3. The source regions of the access transistors Q1.1 and Q1.2 are connected to the drain regions of the biasing transistors Q2.1 and Q2.2, respectively, within the continuous region 302 of the one or more diffusion layers. The source regions of the biasing transistors Q2.1 and Q2.2 are connected to the drain region of the antifuse transistor Q3 and the source region of the antifuse transistor Q3, respectively, within the continuous region 302 of the one or more diffusion layers. In an exemplary embodiment, the continuous region 302 of the one or more diffusion layers is doped with impurity atoms of a donor type, such as phosphorus, arsenic, or antimony to provide some examples, that are capable of donating an electron to form active regions of n-type metal-oxide-semiconductor (NMOS) devices.

As additionally illustrated in FIG. 3, the WLs 252.1 through 252.3 are situated within the one or more polysilicon layers, illustrated using light gray shading in FIG. 3, of the semiconductor layer stack. The one or more polysilicon layers can be doped with impurity atoms of the acceptor type or of the donor type to form the WLs 252.1 through 252.3. Although not shown in FIG. 3, the access transistors Q1.1 and Q1.2, the biasing transistors Q2.1 and Q2.2, and the antifuse transistor Q3 can be situated within specially implanted regions, known as wells, that can increase the number of carrier holes and/or carrier electrons located in the semiconductor substrate. The semiconductor substrate can be implanted with the atoms of the acceptor type and atoms of the donor type to fabricate a specially implanted p-type well region and a specially implanted n-type well region, respectively.

As further illustrated in FIG. 3, the BL 250 is situated within the one or more metal layers, illustrated using dark shading in FIG. 3, of the semiconductor layer stack. In an exemplary embodiment, the BL 250 can be shared by other non-volatile memory cells within a column of an array of non-volatile memory cells of the non-volatile data storage device. In this exemplary embodiment, the WLs 252.1 through 252.3 can be shared by other non-volatile memory cells within a row of an array of the non-volatile data storage device.

CONCLUSION

The following Detailed Description referred to accompanying figures to illustrate exemplary embodiments consistent with the disclosure. References in the disclosure to "an exemplary embodiment" indicates that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A memory cell, comprising:
   an antifuse; and
   memory access circuitry having a first biasing transistor and a second biasing transistor serially coupled to the antifuse and a first access transistor and a second access transistor serially coupled to the first biasing transistor and the second biasing transistor, respectively,
   wherein the first access transistor and the first biasing transistor form a first signal pathway and the second access transistor and the second biasing transistor form a second signal pathway, wherein the antifuse is configured to be programmed by rupturing the antifuse causing current to flow from the antifuse through the first signal pathway or through the second signal pathway, wherein the first access transistor and the second access transistor are each a thin oxide transistor, and the first biasing transistor and the second biasing transistor are each a thick oxide transistor, and wherein the thick oxide transistors have a thicker gate oxide compared to a gate oxide of the thin oxide transistors.

2. The memory cell of claim 1, wherein the antifuse comprises:
an antifuse transistor configured to:
form a first short circuit between a gate region of the antifuse transistor and a drain region of the antifuse transistor upon programming the antifuse when the first access transistor and the first biasing transistor are operable, or
form a second short circuit between the gate region and a source region of the antifuse transistor upon programming the antifuse when the first access transistor or the first biasing transistor are inoperable.

3. The memory cell of claim 2, wherein at least one of the first access transistor, the first biasing transistor, the second access transistor, the second biasing transistor, and the antifuse transistor is a field effect transistor (FET).

4. The memory cell of claim 2, wherein the antifuse is configured to be programmed by applying a programming voltage that ruptures a dielectric of the antifuse transistor causing the current to flow from the antifuse transistor through the first signal pathway or through the second signal pathway.

5. The memory cell of claim 4, wherein the dielectric comprises:
silicon dioxide (SiO$_2$), or
an oxide-nitride-oxide (ONO).

6. The memory cell of claim 1, wherein the current flows through the first signal pathway when the first access transistor and the first biasing transistor are operable or through the second signal pathway when the first access transistor or the first biasing transistor are inoperable.

7. The memory cell of claim 1, wherein at least respective portions of the first biasing transistor, the second biasing transistor, the first access transistor, the second access transistor and the antifuse are situated within a continuous region of an oxide diffusion (OD) layer of a semiconductor layer stack.

8. The memory cell of claim 1, wherein the first signal pathway and the second signal pathway represent redundant signal pathways to access the antifuse.

9. The memory cell of claim 1, further comprising:
a first wordline (WL) from among a plurality of WLs configured to couple a gate region of the first biasing transistor and a gate region of the second biasing transistor;
a second WL from among the plurality of WLs configured to couple a gate region of the first access transistor and a gate region of the second access transistor; and
a bitline (BL) configured to couple a drain region of the first access transistor and a drain region of the second access transistor.

10. The memory cell of claim 1, wherein the thin oxide transistors turn on or off faster than the thick oxide transistors based on their relative gate oxide thicknesses.

11. A memory cell, comprising:
an antifuse; and
memory access circuitry having a first access transistor and a first biasing transistor arranged to form a first signal pathway and a second access transistor and a second biasing transistor arranged to form a second signal pathway, the first signal pathway and the second signal pathway being coupled to the antifuse,
wherein the antifuse is configured to be programmed by rupturing the antifuse causing current to flow from the antifuse through the first signal pathway or through the second signal pathway,
wherein the first access transistor and the second access transistor are each a thin oxide transistor, and the first biasing transistor and the second biasing transistor are each a thick oxide transistor, and
wherein the thick oxide transistors have a thicker gate oxide compared to a gate oxide of the thin oxide transistors.

12. The memory cell of claim 11, wherein the current flows from the antifuse through the first signal pathway when the first access transistor and the first biasing transistor are operable or through the second signal pathway when the first access transistor or the first biasing transistor are inoperable.

13. The memory cell of claim 11, wherein the antifuse comprises:
an antifuse transistor configured to:
form a first short circuit between a gate region of the antifuse transistor and a drain region of the antifuse transistor upon programming the antifuse when the first access transistor and the first biasing transistor are operable, or
form a second short circuit between the gate region and a source region of the antifuse transistor upon programming the antifuse when the first access transistor or the first biasing transistor are inoperable.

14. The memory cell of claim 13, wherein the antifuse transistor is configured to be programmed by applying a programming voltage that ruptures a dielectric of the antifuse transistor causing the current to flow from the antifuse transistor through the first signal pathway or through the second signal pathway.

15. The memory cell of claim 14, wherein the dielectric comprises:
silicon dioxide (SiO$_2$), or
an oxide-nitride-oxide (ONO).

16. The memory cell of claim 13, wherein at least one of the first access transistor, the first biasing transistor, the second access transistor, the second biasing transistor, and the antifuse transistor is a field effect transistor (FET).

17. The memory cell of claim 11, wherein at least respective portions of the first biasing transistor, the second biasing transistor, the first access transistor, the second access transistor, and the antifuse are situated within a continuous region of an oxide diffusion (OD) layer of a semiconductor layer stack.

18. The memory cell of claim 17, wherein source regions of the first access transistor and the second access transistor are connected to drain regions of the first biasing transistor and the second biasing transistor, respectively, within the continuous region, and
wherein source regions of the first biasing transistor and the second biasing transistor are connected to the antifuse within the continuous region.

19. The memory cell of claim 11, wherein the first signal pathway and the second signal pathway represent redundant signal pathways to access the antifuse.

20. The memory cell of claim 11, further comprising:
a first wordline (WL) from among a plurality of WLs configured to couple a gate region of the first biasing transistor and a gate region of the second biasing transistor;
a second WL from among the plurality of WLs configured to couple a gate region of the first access transistor and a gate region of the second access transistor; and
a bitline (BL) configured to couple a drain region of the first access transistor and a drain region of the second access transistor.

21. The memory cell of claim 11, wherein the thin oxide transistors turn on or off faster than the thick oxide transistors based on their relative gate oxide thicknesses.

22. A memory cell from among a plurality of memory cells, the plurality of memory cells being arranged in a plurality of rows and a plurality of columns, the memory cell comprising:
an antifuse transistor; and
memory access circuitry configured to couple a bitline (BL) corresponding to a column from among the plurality of columns to the antifuse transistor via a first signal pathway and to couple the BL to the antifuse transistor via a second signal pathway, the first signal pathway and the second signal pathway representing redundant signal pathways to access the antifuse transistor,
wherein a wordline (WL) corresponding to a row from among the plurality of rows is configured to provide a programming voltage to form a conductive short circuit pathway between a gate region of the antifuse transistor and a drain region of the antifuse transistor when the first signal pathway is operable or to form a second conductive short circuit pathway between the gate region and a source region of the antifuse transistor when the first signal pathway is inoperable,
wherein the programming voltage ruptures a dielectric region of the antifuse transistor causing current to flow from the antifuse transistor through the first signal pathway or through the second signal pathway,
wherein the first signal pathway comprises a first biasing transistor coupled to the antifuse transistor and a first access transistor coupled to the first biasing transistor,
wherein the second signal pathway comprises a second biasing transistor coupled to the antifuse transistor and a second access transistor coupled to the second biasing transistor,
wherein the first access transistor and the second access transistor are each a thin oxide transistor, and the first biasing transistor and the second biasing transistor are each a thick oxide transistor, and
wherein the thick oxide transistors have a thicker gate oxide compared to a gate oxide of the thin oxide transistors.

23. The memory cell of claim 22, wherein the antifuse transistor is situated within a continuous region of an oxide diffusion (OD) layer of a semiconductor layer stack.

24. The memory cell of claim 22, further comprising:
a second WL, corresponding to the row, configured to couple a gate region of the first biasing transistor and a gate region of the second biasing transistor; and
a third WL, corresponding to the row, configured to couple a gate region of the first access transistor and a gate region of the second access transistor,
wherein the BL is further configured to couple a drain region of the first access transistor and a drain region of the second access transistor.

25. The memory cell of claim 22, wherein the thin oxide transistors turn on or off faster than the thick oxide transistors based on their relative gate oxide thicknesses.

* * * * *